(12) United States Patent
Suzuki et al.

(10) Patent No.: US 6,188,237 B1
(45) Date of Patent: Feb. 13, 2001

(54) IMPEDANCE MATCHING CIRCUIT, HIGH SPEED SEMICONDUCTOR INTEGRATED CIRCUIT EMPLOYING THE SAME AND COMPUTER SYSTEM EMPLOYING THE INTEGRATED CIRCUIT

(75) Inventors: Azuma Suzuki, Tokyo; Shigeyuki Hayakawa, Kanagawa-ken, both of (JP)

(73) Assignee: Kabushiki Kaisha Toshiba, Kanagawa-ken (JP)

( * ) Notice: Under 35 U.S.C. 154(b), the term of this patent shall be extended for 0 days.

(21) Appl. No.: 09/316,162

(22) Filed: May 21, 1999

(30) Foreign Application Priority Data

May 25, 1998 (JP) .................................................. 10-143303

(51) Int. Cl.[7] .................................................. H03K 17/16
(52) U.S. Cl. .................................. 326/30; 326/86; 326/87
(58) Field of Search ................................... 326/30, 33, 34, 326/86, 87, 90, 91; 327/108

(56) References Cited

U.S. PATENT DOCUMENTS 5,606,275   2/1997   Farhang et al. ....................... 327/108
5,621,335 * 4/1997   Andersen ............................... 326/30

* cited by examiner

Primary Examiner—David Nelms
Assistant Examiner—David Lam
(74) Attorney, Agent, or Firm—Banner & Witcoff, Ltd.

(57) ABSTRACT

A high speed impedance matching circuit suitable for use in high speed semiconductor integrated circuits matches the output impedance of a semiconductor device to the impedance of other devices such a computer system bus thereby reducing signal reflections caused by impedance mismatches and which can adversely affect the operation of a high speed computer system. The impedance of an output buffer is matched to the impedance of an external resistor.

22 Claims, 8 Drawing Sheets

IMPEDANCE MATCHING CIRCUIT, HIGH SPEED SEMICONDUCTOR INTEGRATED CIRCUIT EMPLOYING THE SAME AND COMPUTER SYSTEM EMPLOYING THE INTEGRATED CIRCUIT

BACKGROUND OF THE INVENTION

1. Field of the Invention

The present invention relates to a high-speed output circuit disposed on a periphery of a semiconductor integrated circuit, the output circuit interfacing between the semiconductor integrated circuit and an external circuitry or a system bus supposed to be connected to the semiconductor integrated circuit. The high-speed output circuit is well suited for a high speed semiconductor integrated circuit, such as an SRAM, composing a computer system. In particular, the present invention relates to a technique of matching the impedance of an output buffer in the output circuit on a large scale integrated circuit (LSI) with the impedance of the external circuitry or the system bus in the computer system.

2. Description of the Prior Art

LSI chips installed in a computer system are connected to a system bus of the computer system through respective output circuits disposed on the periphery of the LSI chips. As the interface circuit, a small signal amplitude interface circuit, for example, a high-speed transistor logic (HSTL) is recently employed. Each of the impedance of the output circuits of the LSI chips and that of the system bus must match with each other, otherwise signals are reflected at the interface to hinder the operation speed of the LSI and prevent the computer system from fully using the intrinsic high-speed performance of the LSI.

It is very important, therefore, to match the impedance of the system bus of the computer system with that of respective output buffers in the output circuits disposed on the LSI chips, which are supposed to be connected to the system bus. Another problem is that the output impedance of semiconductor elements that form the output buffer of the LSI chip varies in response to a change in a system supply voltage, thereby causing an impedance mismatch between the output buffer and the system bus. This raises a necessity of an impedance matching circuit capable of speedily coping with a change in a system supply voltage.

To realize an impedance matching between the output buffer of an LSI chip and a system bus, an effort for standardization of specifications has been conducted by a technology employing an output circuit referred as "a programmable impedance output circuit". In the methodology employing the programmable impedance output circuit, an external resistor whose value is determined depending on requirements by users is connected between "a ZQ-pin" of the LSI package and a system bus held at a low level supply voltage VSS arranged on the system bus. The LSI chip periodically samples and sets the impedance of the output buffer of the LSI chip to an inverse multiple (for example, ⅕) of the impedance of the external resistor.

Even if a system supply voltage varies, the programmable impedance output circuit is expected always to match the impedance of the LSI chip's output buffer with the specific impedance, thereby securing a high-speed interfacing operation between the LSI chip and the system bus.

Figure 1:
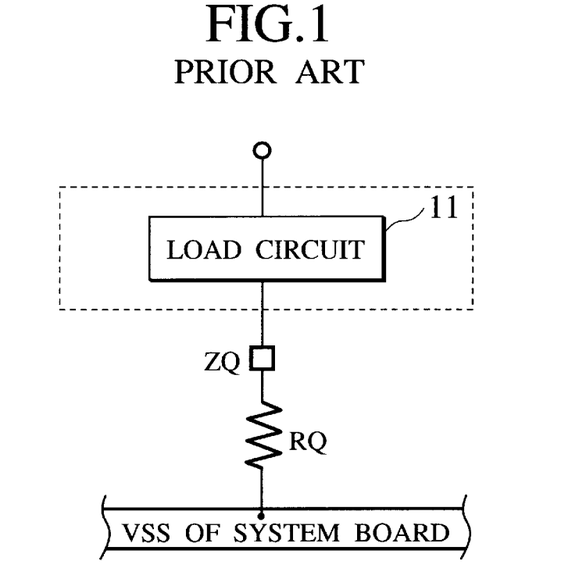
FIG. 1 shows an equivalent circuit representation of a monitor circuit according to a prior art, for monitoring the resistance of an external resistor RQ connected between a specific terminal (ZQ-terminal) and VSS of system board.

FIG. 1 shows an equivalent circuit of the programmable impedance output circuit according to a prior art. The external resistor RQ is equivalently represented as being connected between a ZQ-terminal and the low level voltage source VSS, and the resistance of the external resistor RQ is monitored. Practically, the external resistor RQ is connected between the ZQ-pin of the LSI package and VSS of the system board (the system bus held at the low level supply voltage VSS), which is usually a grounding (GND) level system bus of the system board. The ZQ-terminal and the ZQ-pin is connected by a known internal structure of the LSI package, such as bonding wire or wiring bump. A load circuit 11 comprises, for example, a MOS transistor. A resistance ratio between the output impedance of the load circuit 11 and the external resistor RQ determines a potential VZQ at the ZQ-terminal. The potential VZQ is used to detect the resistance of the external resistor RQ.

Figure 2:
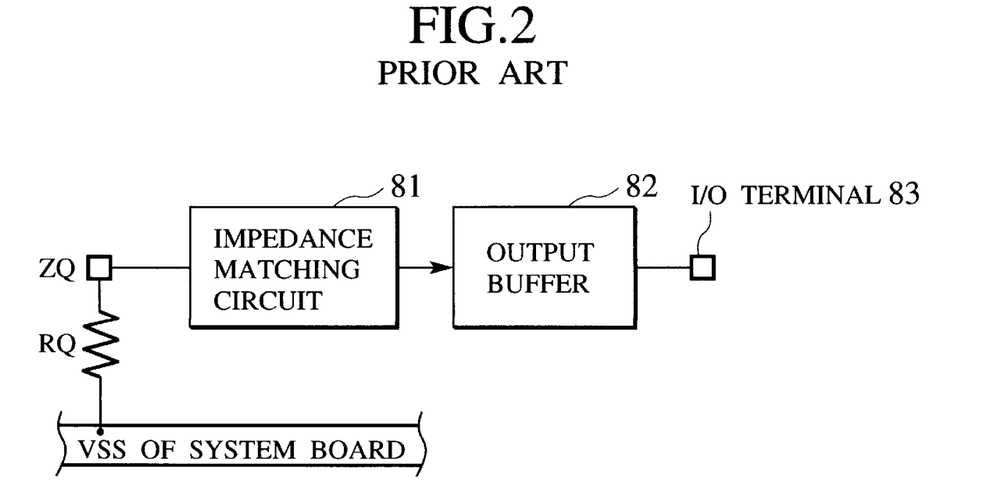
FIG. 2 shows an equivalent circuit representation of a programmable impedance output circuit merged in an LSI chip according to a prior art.
Figure 3:
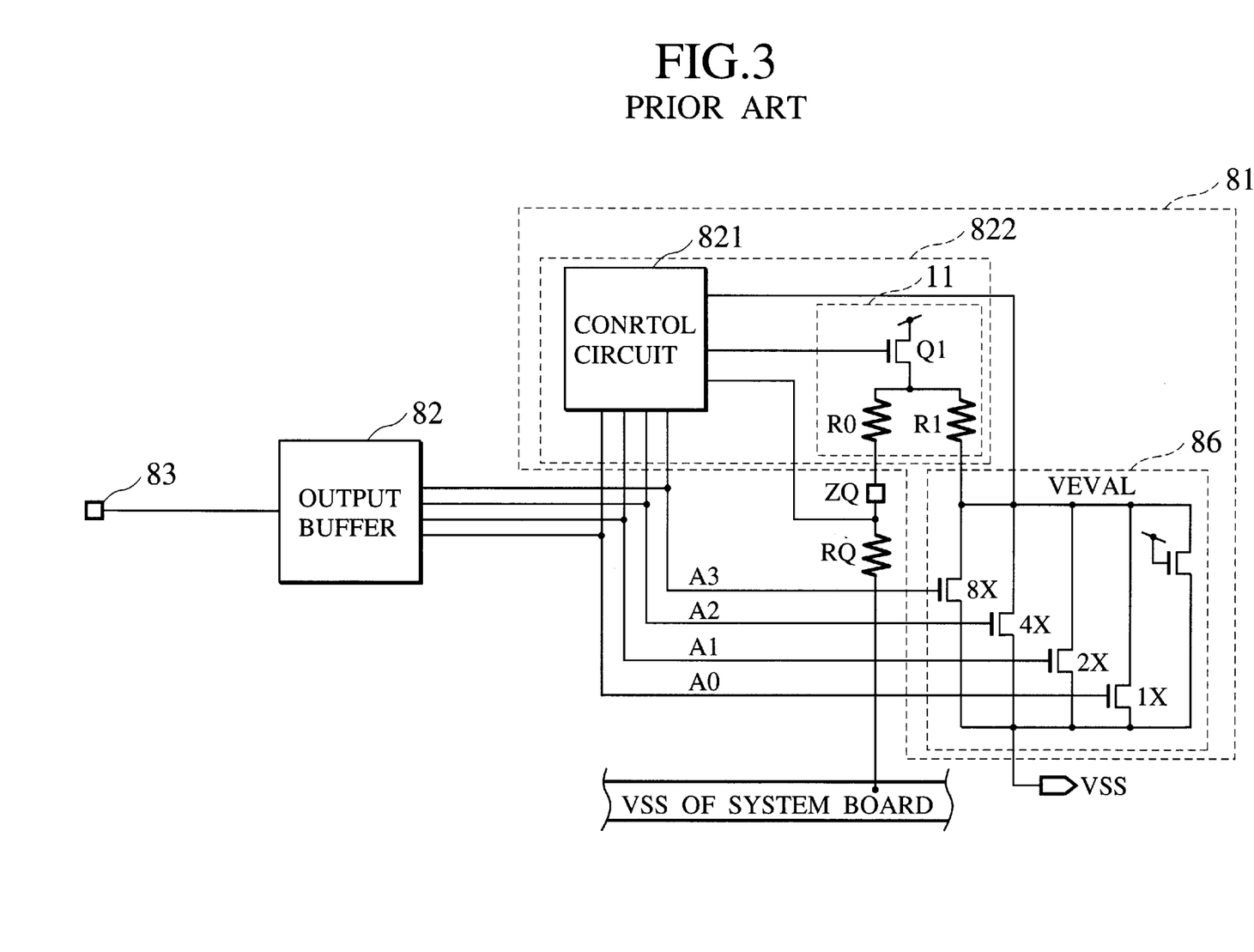
FIG. 3 shows the details of an impedance matching circuit incorporated in the programmable impedance output circuit of FIG. 2.

FIG. 2 shows an example of the structure of the programmable impedance output circuit of the prior art. An impedance matching circuit 81 consists of an external resistance monitor 822 and an A/D converter (dummy buffer) 86 as shown in FIG. 3. The dummy buffer 86 has plural MOS transistors, for example, four MOS transistors 1X, 2X, 4X, and 8X arranged in parallel with one another between a potential VEVAL and the low level voltage source VSS. The MOS transistors 1X to 8X have different gate widths (channel widths) "Ws". More precisely, the gate width W of the MOS transistor 8X is eight ($=2^3$) times wider than that of the MOS transistor 1X. The gate width W of the MOS transistor 4X is four ($=2^2$) times wider than that of the MOS transistor 1X. The gate width W of the MOS transistor 2X is two ($=2^1$) times wider than that of the MOS transistor 1X. Namely, these parallel-connected four MOS transistors provide different on-state resistance $R_{ON}$, and therefore different impedance values respectively.

The programmable impedance output circuit of FIG. 2 detects the impedance of the external resistor RQ according to the potential VZQ at the ZQ-terminal and separately controls the ON/OFF states of the MOS transistors 1X to 8X in synchronization with a sampling clock signal, to match the combined impedance of the MOS transistors 1X to 8X with the impedance of the external resistor RQ. Thereafter, the impedance matching circuit 81 matches the combined impedance of the output buffer 82 with the impedance of the external resistor RQ (or an inverse multiple of the impedance of the external resistor RQ).

The load circuit 11 (FIG. 3) consists of a MOS transistor Q1 and resistors R0 and R1. The resistors R0 and R1 have fixed value of resistances respectively, and therefore, the potential VZQ at the ZQ-terminal rises as the external resistance RQ becomes larger and drops as the same becomes smaller.

After the MOS transistor Q1 in the load circuit 11 is turned on, the control circuit 821 sends a set of data consisting of high level "1" and low level "0" as potential values A0 to A3 applied to the respective gate electrodes of the MOS transistors 1X to 8X. Namely, the control circuit 821 separately turns on and off the MOS transistors 1X to 8X to equalize the potential VZQ at the ZQ-terminal to the high potential VEVAL of the dummy buffer 86. According to the set of data A0 to A3 sent from the control circuit 821, the combined impedance of the dummy buffer 86 is matched with the impedance of the external resistor RQ or an inverse multiple of the impedance of the external resistor RQ.

Unlike a resistor, a MOS transistor shows nonlinear characteristics in its triode (ohmic) regime. A drain voltage (drain-source voltage) $V_{DS}$ of the MOS transistor is dependent on a drain current (drain-source current) $I_{DS}$ thereof. Namely, a drain voltage $V_{DS}$ of each of the MOS transistors 1X to 8X varies depending on the value of the external resistor RQ. Even if the control circuit 821 properly sends the set of the data A0 to A3 so that the combined impedance determined by the combination of respective sizes, or the respective gate widths Ws of the MOS transistors may correspond to the external resistor RQ, a drain current $I_{DS}$ of each of the MOS transistors will deviate from a current flowing through the external resistor RQ if the drain voltage $V_{DS}$ changes. On the other hand, the impedance of the output buffer 82 is set based on a fixed drain voltage $V_{DS}$. Accordingly, the programmable impedance output circuit of the prior art is unable to correctly match the impedance of the external resistor RQ with that of the output buffer 82.

Generally, the programmable impedance output circuit receives a dedicated high level supply voltage VDDQ that is lower than a main high level supply voltage VDD of an LSI chip, to easily realize an impedance matching. The fixed voltage used to define the impedance of the output buffer 82 is usually set to be ½ of the dedicated high level supply voltage VDDQ.

Figure 4:
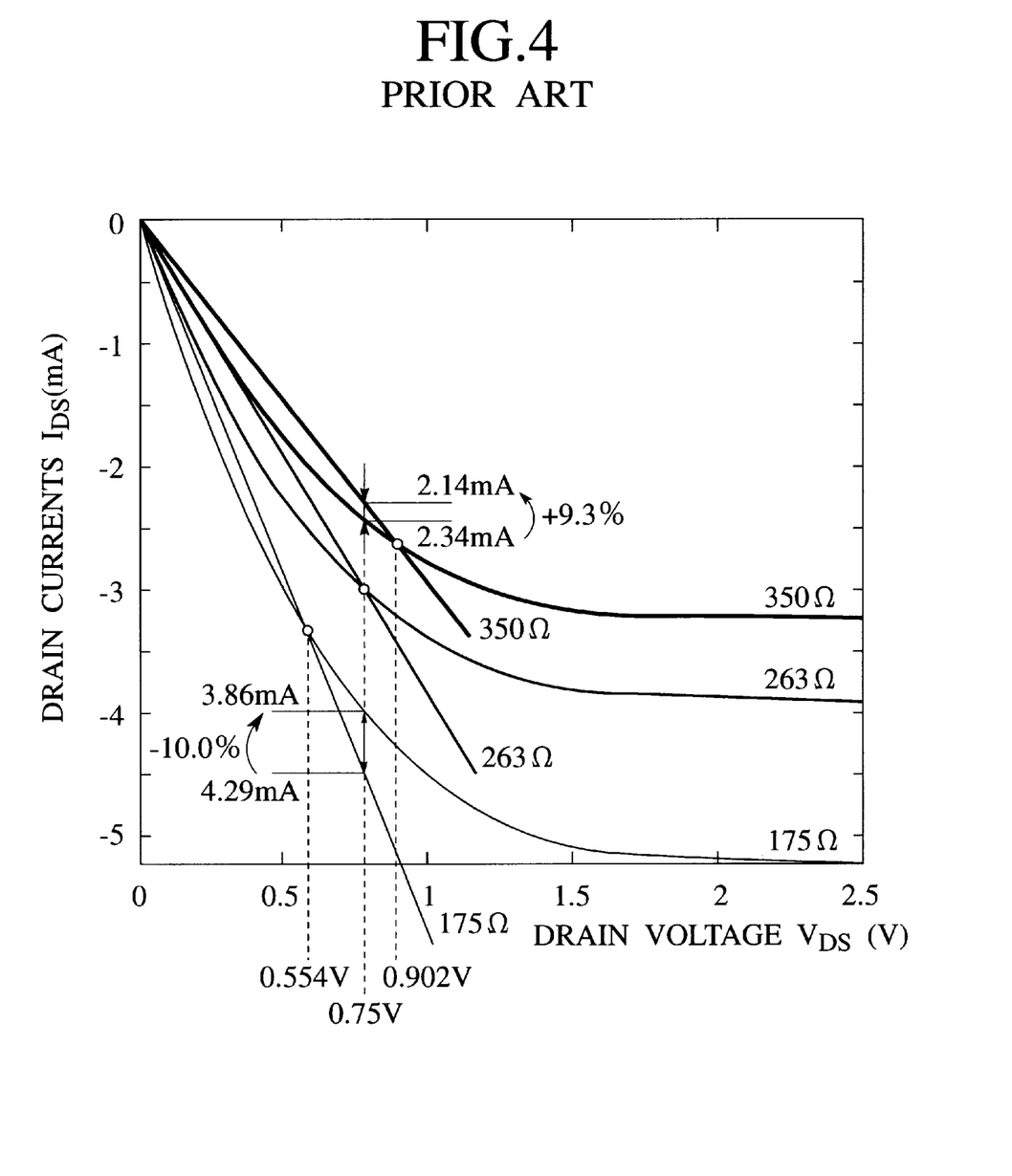
FIG. 4 shows matching errors due to the drain voltage-drain current characteristics of MOS transistors.

Then, even if the impedance of the output buffer 82 is tried to be matched with that of the external resistor RQ, a matching error occurs due to the characteristics of the MOS transistors as mentioned above. FIG. 4 shows a relationship between the drain voltage $V_{DS}$ and the drain current $I_{DS}$ of MOS transistors and explains the matching errors due to the I-V characteristics of MOS transistors.

For example, suppose that the impedance of the dummy buffer 86 is defined according to VDDQ/2 with $175\Omega \leq RQ \leq 350\Omega$, VDDQ=1.5 V at room temperature.

R0 (=R1) is set to make VZQ=VDDQ/2 when RQ=(175+350)/2=263. When RQ=350Ω, VZQ (=$V_{DS}$)=0.902 V, and the impedance of the dummy buffer 86 is matched with that of the external resistor RQ by external insertion method.

With respect to the matched MOS transistors of the dummy buffer 86, the actual impedance of the output buffer 82 whose $V_{DS}$ is defined based on VDDQ/2 deviates from the impedance of the external resistor RQ by +9.3%. Similarly, an impedance error of −10.0% occurs at RQ=175Ω.

In addition to the impedance error due to the I-V characteristics of MOS transistors, there are "size step errors" in the sizes (gate widths Ws) of MOS transistors due to manufacturing errors. These errors make it difficult to keep a product specification error of ±10% in the impedance of the output buffer 82.

SUMMARY OF THE INVENTION

An object of the present invention is to provide an impedance matching circuit capable of restricting an impedance matching error within the range of ±10% when matching the impedance of an output buffer with the impedance of an external resistor, or with a reciprocal of an integer multiple of the impedance of the external resistor.

Another object of the present invention is to provide an impedance matching circuit capable of restricting an impedance matching error within the range of ±10% when matching the impedance of pull-down and pull-up output buffers, in particular, the pull-up output buffer with the impedance of an external resistor, or with a reciprocal of an integer multiple thereof.

Still another object of the present invention is to provide an impedance matching circuit applicable for a semiconductor integrated circuit operating at a low supply voltage.

Still another object of the present invention is to provide an impedance matching circuit capable of stably matching the impedance of an output buffer with that of an external resistor irrespective of noise in a supply voltage.

Still another object of the present invention is to provide a semiconductor integrated circuit disposed on a semiconductor chip capable of realizing a precise and stable impedance matching between an output circuit arranged on the semiconductor chip and an external circuit (or a system bus) scheduled to be connected to the semiconductor integrated circuit, and to fully manifest the intrinsic high-speed performance of the semiconductor integrated circuit.

Still another object of the present invention is to provide a high-speed, high-performance computer system capable of realizing a precise and stable impedance matching between a system bus of a system board and an output circuit of a semiconductor integrated circuit, to prevent signal reflection between the system bus and the integrated circuit and fully use the intrinsic high-speed performance of the integrated circuit.

In order to accomplish the objects, a first aspect of the present invention provides an impedance matching circuit that is arranged between an output buffer and a specific terminal (ZQ-terminal) disposed on a semiconductor chip. The output buffer may be connected to a peripheral circuit for driving an internal circuit, or a core circuit disposed on the semiconductor chip. The specific terminal (ZQ-terminal) is provided for connecting an external resistor RQ, via a ZQ-pin of the package, which mounts and molds the semiconductor chip. The ZQ-terminal is connected to the ZQ-pin of the package through a known internal structure of the package such as a bonding wire or a wiring bump. The impedance matching circuit has an external resistance monitoring circuit and a dummy buffer, whose circuit configuration is identical or similar (homothetic) to the output buffer. The output buffer and dummy buffer are each made of the same number of transistors connected in parallel with one another. These transistors are selectively and independently turned on and off to control the combined total impedance of the output and dummy buffers. The external resistance monitoring circuit has a generator for generating a reference potential, a potential controller for fixing a potential VZQ at the ZQ-terminal at the reference potential irrespective of the value of the external resistor RQ, a detector for detecting a current passing through the external resistor RQ when the potential VZQ is fixed at the reference potential, and a matching controller for matching the impedance of the output buffer with the impedance of the external resistor RQ determined according to a current detected by the detector. Or the matching controller of the first aspect of the present invention matches the impedance of the output buffer with "an inverse multiple" of the impedance of the external resistor RQ determined according to the current detected by the detector. Here, "the inverse multiple" is defined as the product of the external resistor RQ by a reciprocal of an integer, such as ⅕.

In the first aspect of the present invention, the resistance of the external resistor RQ is optionally selected by the users. Without being affected by the external resistance RQ, or the value of the external resistor RQ, the potential VZQ at the ZQ-terminal is always set to the predetermined reference potential. By equalizing the reference potential to a potential of the first main electrodes of the transistors composing the dummy buffer, the potential at the ZQ-terminal is always kept at a potential for the output buffer, irrespective of the value of the external resistor RQ. Here the first main electrode is defined as one of source electrode and drain electrode in MOS transistor, or one of emitter electrode and collector electrode in bipolar transistor (BJT). The second main electrodes of the transistors composing the dummy buffer are connected to the low level power source. If we specify the first main electrode as source electrode, the second main electrode is drain electrode, and vice versa. If we prescribe the first main electrode as emitter electrode in BJT, the second main electrode is collector electrode, and vice versa. The impedance of the external resistor RQ is detected by the detector from a current passing through the external resistor RQ, and the impedance of the output buffer is matched with the detected impedance of the external resistor RQ (or, the impedance of the output buffer is matched with the inverse multiple of the detected impedance of the external resistor RQ).

The external resistance monitoring circuit in the impedance matching circuit of the first aspect of the present invention may have a current mirror circuit. The current mirror circuit transfer a given current, that is equal to a current passing through the external resistor RQ, to the dummy buffer. The matching controller equalizes a voltage applied to the dummy buffer to the voltage at the ZQ-terminal, and then, matches the impedance of the output buffer, which is identical or similar (homothetic) to the dummy buffer, with the impedance of the external resistor RQ or the inverse multiple thereof.

A second aspect of the present invention provides an impedance matching circuit connected to pull-down and pull-up output buffers and to a specific terminal (ZQ-terminal) disposed on a semiconductor chip. The pull-down and pull-up output buffers of the semiconductor chip are connected to a peripheral circuit for driving an internal circuit (a core circuit) disposed on the semiconductor chip. The impedance matching circuit has an external resistance monitoring circuit, a pull-down dummy buffer that is identical or similar (homothetic) to the pull-down output buffer, and a pull-up dummy buffer that is identical or similar (homothetic) to the pull-up output buffer. The pull-down output and dummy buffers consist each of transistors connected in parallel with one another. These transistors are selectively turned on and off to control the combined impedance of the buffers. Similarly, the pull-up output and dummy buffers consist each of transistors connected in parallel with one another. These transistors are selectively turned on and off to control the combined impedance of the buffers. The external resistance monitoring circuit consists of a generator for generating a reference potential, a potential controller for fixing a potential VZQ at the ZQ-terminal at the reference potential, irrespective of the value of the external resistor RQ, a detector for detecting a current passing through the external resistor RQ when the potential VZQ is fixed at the reference potential, a pull-down matching controller for matching the impedance of the pull-down output buffer with the pull-down impedance of the external resistor RQ determined according to a current detected by the detector, or an inverse multiple of the pull-down impedance of the external resistor RQ, and a pull-up matching controller for matching the impedance of the pull-up output buffer with the pull-up impedance of the external resistor RQ determined according to a current flowing to the detector, or an inverse multiple of thereof.

According to the second aspect of the present invention, the external resistance monitoring circuit may have first and second current mirror circuits. The first current mirror circuit transfers a given current that is equal to a current passing through the external resistor RQ to the pull-down dummy buffer. The pull-down matching controller adjusts a voltage applied to the first main electrode of the transistors composing the pull-down dummy buffer to the voltage at the ZQ-terminal. Here the first main electrode is defined as one of source and drain electrodes in MOS transistor, or one of emitter and collector electrodes in BJT. The second main electrodes of the transistors composing the pull-down dummy buffer are connected to the low level power source. If we specify the first main electrode as source electrode in MOS transistor, the second main electrode is drain electrode, and vice versa. If we define the first main electrode as emitter electrode in BJT, the second main electrode is collector electrode, and vice versa.

On the contrary, the pull-up dummy buffer transfers the given current, which is equal to the current passing through the external resistor RQ, to the second current mirror circuit. The pull-up matching controller adjusts a voltage applied to the second main electrode of the transistors composing the pull-up dummy buffer to the voltage at the ZQ-terminal. Here the second main electrode is defined as one of source and drain electrodes in MOS transistor, or one of emitter and collector electrodes in BJT. The first main electrodes of the transistors composing the pull-up dummy buffer are connected to a high level power source.

The set of the control data used for an impedance matching of the pull-down dummy buffer is used to match the impedance of the pull-down output buffer with the pull-down impedance of the external resistor RQ (or an inverse multiple thereof). The set of the control data used for an impedance matching of the pull-up dummy buffer is used to match the impedance of the pull-up output buffer with the impedance of the external resistor RQ (or an inverse multiple thereof).

In this way, the second aspect of the present invention employs the pull-down and pull-up dummy buffers to match the impedance of the pull-down and pull-up output buffers with the pull-down and pull-up impedances of the external resistor RQ (or an inverse multiple thereof). According to the set of data used for the impedance matching between the dummy buffers and the external resistor RQ, the pull-down and pull-up matching controllers match the impedance of the pull-down and pull-up output buffers with the pull-down and pull-up impedances of the external resistor RQ (or an inverse multiple thereof). This technique of the second aspect of the present invention improves the matching accuracy of the pull-down and pull-up output buffers. In particular, the matching accuracy of the pull-up output buffer remarkably improves compared with a technique that employs only the pull-down dummy buffer.

A third aspect of the present invention provides a semiconductor integrated circuit having an output circuit that incorporates the impedance matching circuit of the first aspect of the present invention. The semiconductor integrated circuit of the third aspect of the present invention at least has a semiconductor chip, an internal circuit such as a memory cell array or a logic gate circuit, peripheral circuits for driving the internal circuit, a specific terminal (ZQ-terminal) for connecting an external resistor RQ, an output buffer connected to the peripheral circuits, an input/output terminal connected to the output buffer, an external resistance monitoring circuit connected to the ZQ-terminal, and a dummy buffer made of transistors arranged in parallel between the external resistance monitoring circuit and the output buffer. The internal circuit, the peripheral circuit, the specific terminal (ZQ-terminal), the output buffer, the input/output terminal, the external resistance monitoring circuit and the dummy buffer are all disposed on the semiconductor chip. The external resistance monitoring circuit and the dummy buffer are the same as those of the first aspect of the present invention.

According to the third aspect of the present invention, the external resistor RQ has an optionally selected resistance value. Without regard to the magnitude of the external resistance RQ, a potential VZQ at the ZQ-terminal is always set to the reference potential. By equalizing the reference potential to a potential for the output buffer, the potential of the ZQ-terminal is always kept at the reference potential for the output buffer irrespective of the value of the external resistor RQ. The impedance of the external resistor RQ is detected from a current passing therethrough, and the impedance of the output buffer is matched with the detected impedance of the external resistor RQ. As a result, the high-speed performance of the semiconductor integrated circuit is fully utilized to transmit required signals from the semiconductor integrated circuit to an external circuit or to a system bus installed on a system board. The semiconductor integrated circuit may be a high-speed memory such as an SRAM and a current-addressable memory (CAM), or a logic LSI. In particular, the semiconductor integrated circuit of the third aspect of the present invention may be a GaAs-based high-speed LSI chip such as an high electron mobility transistor (HEMT) logic LSI or HEMT memory. In case of the SRAM, the output buffer of the present invention may be connected to a sense amplifier serving as one of the peripheral circuit for driving the core memory array. Anyhow, the output buffer, the input/output terminal, the external resistance monitoring circuit and the dummy buffer serve as an interface circuit that causes no signal reflection between the semiconductor integrated circuit and the external circuit or the system bus.

Further, as already stated in the second aspect of the present invention, the semiconductor integrated circuit of the third aspect may have the pull-down and pull-up dummy buffers to match the impedance of the pull-down and pull-up output buffers, as well as the pull-down and pull-up matching controllers so as to improve the matching accuracy of the pull-down and pull-up output buffers. In particular, the matching accuracy of the pull-up output buffer remarkably improves compared with a technique that employs only the pull-down dummy buffer.

A fourth aspect of the present invention provides a computer system incorporating the semiconductor integrated circuit of the third aspect of the present invention. The computer system has a first system bus, a second system bus held at low level supply voltage VSS, an external resistor connected to the second system bus and the semiconductor integrated circuit whose input/output terminals are connected to the first system bus through input/output pins of the package mounting and molding the semiconductor integrated circuit. As explained above, the semiconductor integrated circuit at least has a semiconductor chip, an internal circuit such as a memory cell array or a logic gate circuit disposed on the semiconductor chip, peripheral circuits for driving the internal circuit, a specific terminal (ZQ-terminal) disposed on the semiconductor chip for connecting an external resistor RQ, an output buffer connected to the peripheral circuits, an input/output terminal connected to the output buffer, an external resistance monitoring circuit connected to the ZQ-terminal, and a dummy buffer made of transistors arranged in parallel with one another between the external resistance monitoring circuit and the output buffer. The specific terminal (ZQ-terminal) is connected to the external resistor RQ through ZQ-pin of the package. The external resistance monitoring circuit and dummy buffer are the same as those of the first aspect of the present invention. The first system bus may be connected to cache memories, data memory management units (DMMUs), buffer circuits, operation units, controllers, etc. The second system bus held at the low level supply voltage VSS may include the low level supply voltage VSS portion of the system board, a grounded case of the system, or a grounded chassis of the system.

The fourth aspect of the present invention realizes a good and stable impedance matching between the output circuit of the semiconductor integrated circuit and the first system bus disposed on the system board of the computer system. Then the fourth aspect of the present invention reduces signal reflection at the interface between them to an ignorable level. As a result, the intrinsic high-speed performance of the semiconductor integrated circuit is fully utilized to transmit signals from the semiconductor integrated circuit to the first system bus at high speed. Consequently, the computer system of the fourth aspect of the present invention operates at high speed.

Further, as stated in the second aspect of the present invention, the semiconductor integrated circuit installed in the computer system of the fourth aspect may have the pull-down and pull-up dummy buffers to match the impedance of the pull-down and pull-up output buffers, as well as the pull-down and pull-up matching controllers so as to improve the matching accuracy of the pull-down and pull-up output buffers.

In the first to fourth aspects of the present invention, we can employ any of MOS field effect transistors (FETs), MIS FETs, MOS static induction transistors (SITs), MIS SITs, BJTs, HEMTs and another transistors as the transistors composing the dummy buffers or output buffers. Further, as the transistors composing the detector in the external resistance monitoring circuit, any of these MOS FETs, MIS FETs, MOS SITs, MIS SITS, BJTs, HEMTs and another transistors can be used, depending on the kind of transistors employed in the internal circuit and the peripheral circuit of the semiconductor integrated circuit. Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of an equivalent circuit of semiconductor integrated circuit, it will be appreciated that the circuit connections are symbolically drawn for facilitating the reading of the drawings, and they may contain a configuration which does not exactly corresponds to a practical structure, omitting such as package pins.

(FIRST EMBODIMENT)

Figure 5:
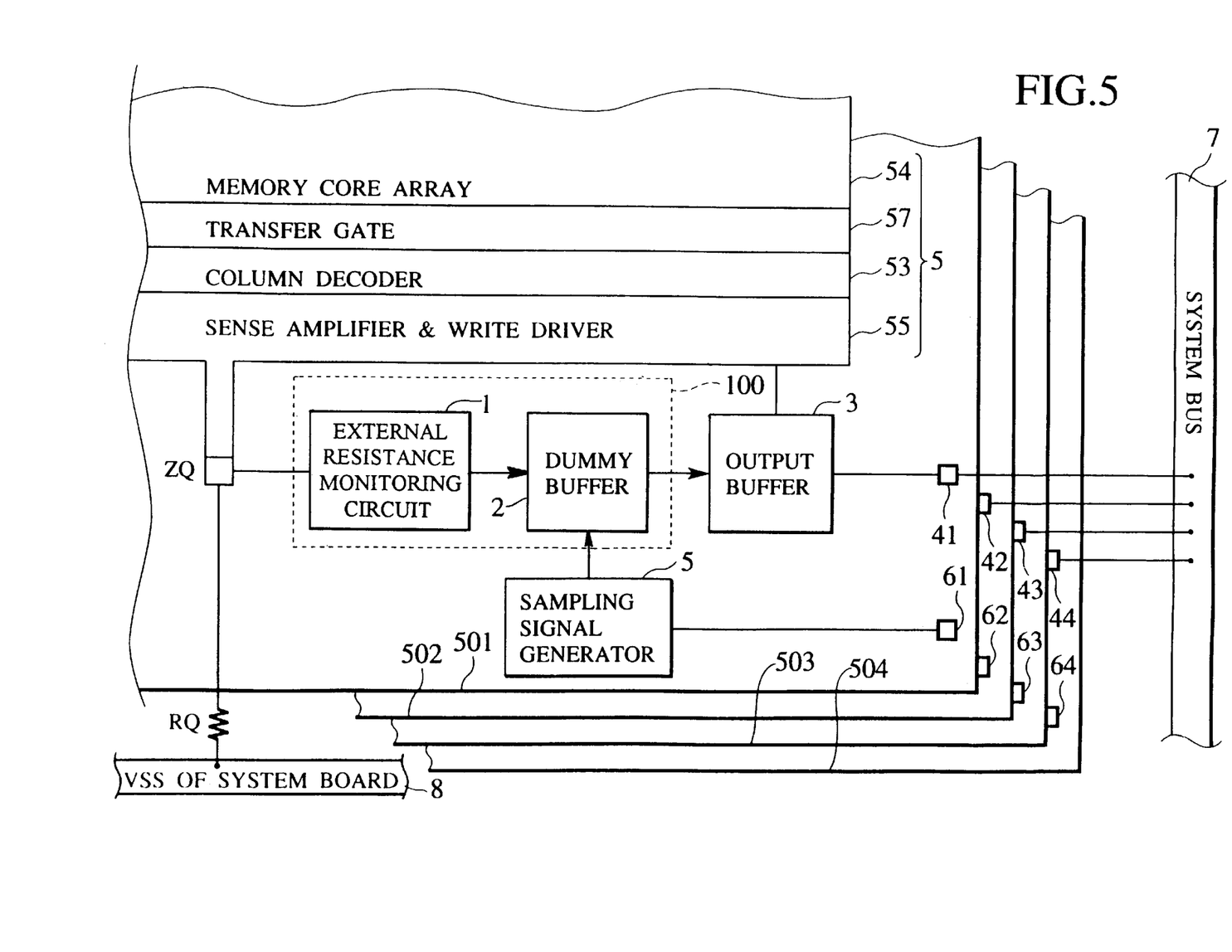
FIG. 5 shows a part of the computer system assembling a plurality of LSI chips, each including an output circuit connected to a system bus (first system bus) according to a first embodiment of the present invention.

FIG. 5 shows a part of the computer system including LSI chips 501 to 504 according to the first embodiment of the present invention. Specifically, FIG. 5 shows an equivalent representation of a peripheral part of an LSI chip 501 according to the first embodiment of the present invention. Here, the respective LSI chips 501 to 504 are supposed to have SRAM memory arrays as a core circuit (an internal circuit), and they are connected to a system bus (first system bus) 7 of the system board in the computer system through input/output (I/O) terminals (pads) 41 to 44 disposed on the perimeters of the LSI chips 501 to 504, respectively. Similarly, clock terminals 61 to 64 are disposed on the perimeters of the LSI chips 501 to 504, respectively. Although omitted in the equivalent circuit representation shown in FIG. 5, each of LSI chips 501 to 504 is practically mounted and molded in a known LSI package, and each of input/output (I/O) terminals 41 to 44 is connected to one of I/O pins of the known LSI package through internal wiring structure of the package. And each clock terminals 61 to 64 is connected to one of clock pins of the package through the internal wiring structure of the package. Then input/output (I/O) terminals 41 to 44 are practically connected to the system bus (first system bus) 7 through the respective I/O pins. The internal wiring structure may be a known structure comprising such as bonding wires or connection bumps. Further, the system bus (first system bus) 7 may be connected to cache memories, DMMUs, buffer circuits, operation units, controllers, etc, which are not shown in the figure to avoid cluttering up of the drawing, because they are known items in the organization of the conventional computer system.

Although the following explanation is made on the top LSI chip 501, the same is applicable to each of the other LSI chips 502 to 504. The number of the LSI chips is not limited to four and is optionally determined depending on the specifications and scale of a given computer system.

As shown in FIG. 5, the I/O terminal 41 disposed on the LSI chip 501 is connected to an output buffer 3. The LSI chip 501 has an SRAM core array 54 as the internal circuit and peripheral circuits comprising a transfer gate 57, a column decoder 53, a sense amplifier and write driver 55, etc. The peripheral circuits comprising the transfer gate 57, the column decoder 53, the sense amplifier and write driver 55, etc. drive the internal circuit (SRAM core array) 54. The sense amplifier and write driver 55 is connected to the output buffer 3. A specific terminal (ZQ-terminal) is discretely arranged on the LSI chip 501. The ZQ-terminal is connected to an electrode terminal of an external resistor RQ through a ZQ-pin of the package (not shown). The ZQ-terminal is connected to the ZQ-pin through internal wiring structure of the package. Another electrode terminal of the external resistor RQ is connected to a low level (VSS) system bus (second system bus) 8, or ground (GND) level system bus 8 disposed on the system board. The second system bus 8 held at the low level supply voltage VSS may include a low level supply voltage VSS portion of the system board, a grounded case of the system, or a grounded chassis of the system. Hence, in the drawings of the present invention, the second system bus 8 is referred as the "VSS of system board". The resistance of the external resistor RQ, or the external resistance RQ is optionally set by users to, for example, 50Ω or 75Ω according to the requirements of the system specifications.

As shown in FIG. 5, an impedance matching circuit 100 is connected between the output buffer 3 and ZQ-terminal (specific terminal). The impedance matching circuit 100 consists of an external resistance monitoring circuit 1 and a dummy buffer 2. The dummy buffer 2 is connected to a sampling signal generator 5 that is arranged outside of and connected to the impedance matching circuit 100.

The external resistance monitoring circuit 1 detects a current passing through the external resistor RQ, determines the impedance of the external resistor RQ accordingly, matches the impedance of the dummy buffer 2 with that of the external resistor RQ, and matches the impedance of the output buffer (pull-down buffer) 3 with the impedance of the external resistor RQ. In some cases, the external resistance monitoring circuit 1 matches the impedance of the output buffer 3 with an inverse multiple of the impedance of the external resistor RQ. Here, "the inverse multiple" is defined as the product of the external resistor RQ by a reciprocal of an integer, such as ⅕. A clock signal is supplied to each of clock pins of the LSI packages from the system. Then a clock terminal 61 on the LSI chip 501 is supplied with the clock signal through the clock pin, and based on the clock signal, the sampling signal generator 5 generates a sampling signal. The sampling signal determines the operation timing of the dummy buffer 2.

Figure 6:
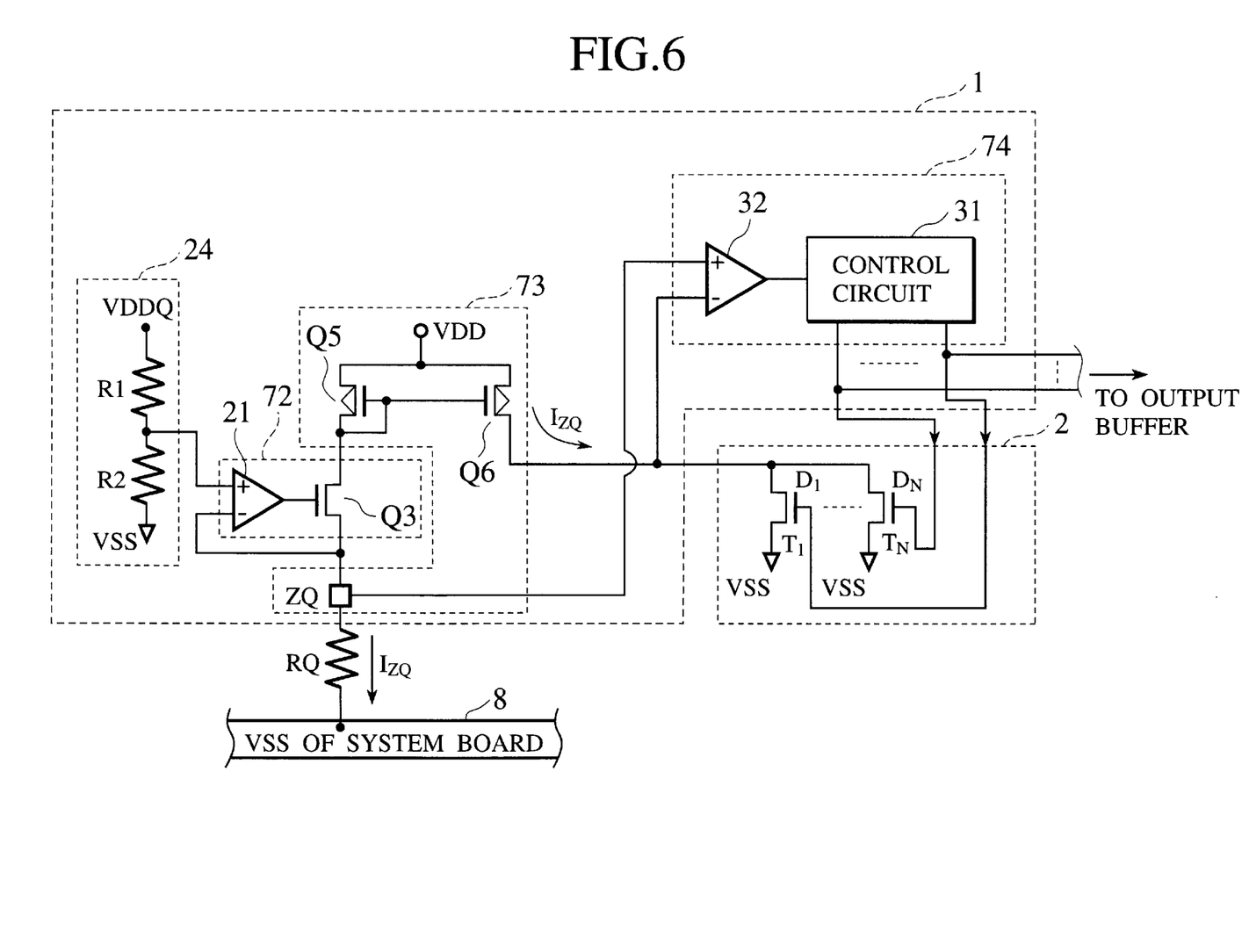
FIG. 6 shows an equivalent circuit representation of an external resistance monitoring circuit and dummy buffer incorporated in the output circuit of FIG. 5.

FIG. 6 shows the details of the impedance matching circuit 100 of FIG. 5 arranged in front of the input side of the output buffer 3. In the impedance matching circuit 100, the external resistance monitoring circuit 1 has a generator 24, a potential controller 72, a detector 73, and a matching controller 74. The generator 24 has a first voltage dividing resistor R1 and a second voltage dividing resistor R2. The resistors R1 and R2 are connected in series to generate a reference potential by dividing a given voltage. The resistor R1 is connected to a first high level voltage source for providing a first high level supply voltage VDDQ that is exclusively used by the impedance matching circuit 100. The resistor R2 is connected to the low level voltage source VSS. Practically, the first high level supply voltage VDDQ and the low level voltage source VSS are supplied through metallic wiring rails (not shown) made of aluminum (Al), aluminum alloy (Al—Si, Al—Cu—Si), copper (Cu) etc., running on the LSI chip 501, respectively. The potential controller 72 has a comparator 21 and a MOS transistor Q3. The comparator 21 has an input terminal connected to a node between the resistors R1 and R2 and another input terminal connected to the ZQ-terminal. An output terminal of the comparator 21 is connected to the control electrode (gate electrode) of the MOS transistor Q3, which is a voltage control transistor. The potential controller 72 fixes a potential VZQ at the ZQ-terminal at the reference potential provided by the generator 24, and the potential VZQ can maintain the reference potential without affected by the variation of the value of the external resistor RQ. When the ZQ-terminal is fixed at the reference potential by the potential controller 72, the detector 73 detects a current passing through the external resistor RQ. The detector 73 consists of MOS transistor (first transistor) Q5 and MOS transistor (first transistor) Q6 that form a current mirror circuit. The MOS transistor (first transistor) Q5 has a first main electrode connected to a second high level voltage source for supplying a second high level supply voltage VDD that is different from the first high level supply voltage VDDQ, a second main electrode connected to the MOS transistor Q3, and a control electrode (gate electrode) connected to the second main electrode of itself. Practically, the second high level supply voltage VDD is supplied through metallic wiring rail (not shown) disposed on the LSI chip 501. The MOS transistor (second transistor) Q6 has a first main electrode connected to the second high level voltage source VDD, a control electrode connected to the control electrode of the MOS transistor Q5, and a second main electrode. In practice, the detector 73 includes the ZQ-terminal and external resistor RQ to realize a detecting function. The matching controller 74 has an impedance setting comparator 32 and a control circuit 31, to match the impedance of the output buffer 3 with the impedance of the external resistor RQ, which is detected according to the current detected by the detector 73, or an inverse multiple of the impedance of the external resistor RQ. The comparator 32 has an input terminal connected to the ZQ-terminal and another input terminal connected to the second main electrode (source electrode) of the MOS transistor Q6 of the detector 73. The control circuit 31 controls the impedance of the dummy buffer 2 as well as the impedance of the output buffer 3 that has identical or similar circuit configuration to the dummy buffer 2, to a predetermined value. The dummy buffer 2 is an N-bit parallel circuit consisting of nMOS transistors $T_1$ to $T_N$ having different gate width Ws and connected in parallel with one another. For example, the ratio of the gate width Ws of these MOS transistors is $2^0:2^1:2^2:2^3:\ldots:2^{(N-1)}$, and the like. The first main electrodes (drain electrodes) of the respective transistors $T_1$ to $T_N$ composing the dummy buffer 2 are connected to the another input terminal of the comparator 32 and also to the second main electrode (source electrode) of the MOS transistor Q6. The second main electrodes (source electrodes) of the respective transistors $T_1$ to $T_N$ are connected to the low level power source Vss. The output buffer 3 is also an N-bit parallel circuit made of nMOS transistors having the ratio of $2^0:2^1:2^2:2^3:\ldots:2^{(N-1)}$, and the like.

Figure 7:
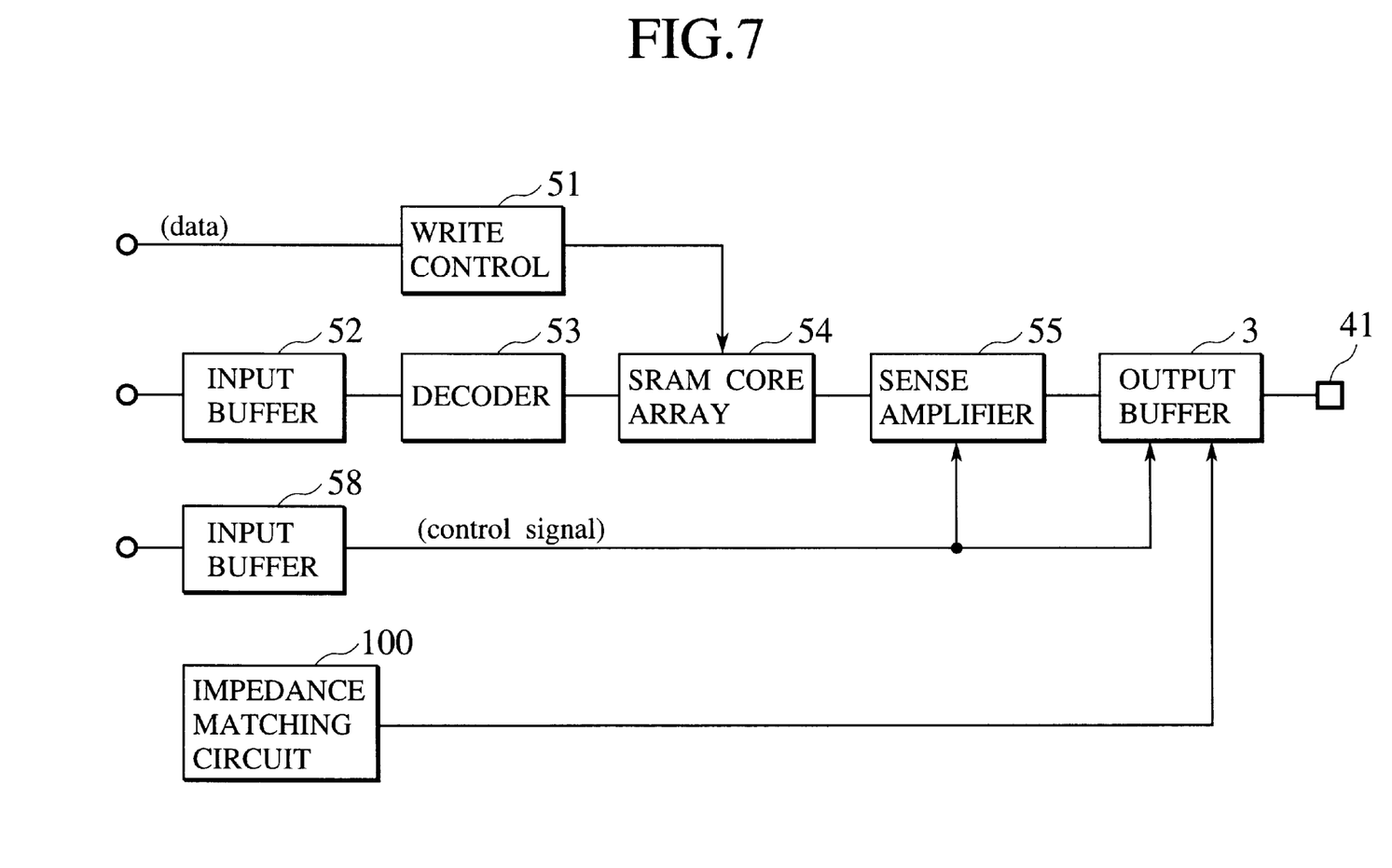
FIG. 7 shows a block diagram to explain an example of the organization of the LSI chip of FIG. 5.

FIG. 7 shows an example of the structure of the LSI chip 501. A write controller 51 writes data into the SRAM core array 54. The data in the SRAM core array 54 is read through the sense amplifier 55. The read data is passed through the output buffer 3 and I/O terminal 41 and is transferred to the system bus (first system bus) 7. At this time, the impedance of the output buffer 3 is set by the impedance matching circuit 100.

Figure 8:
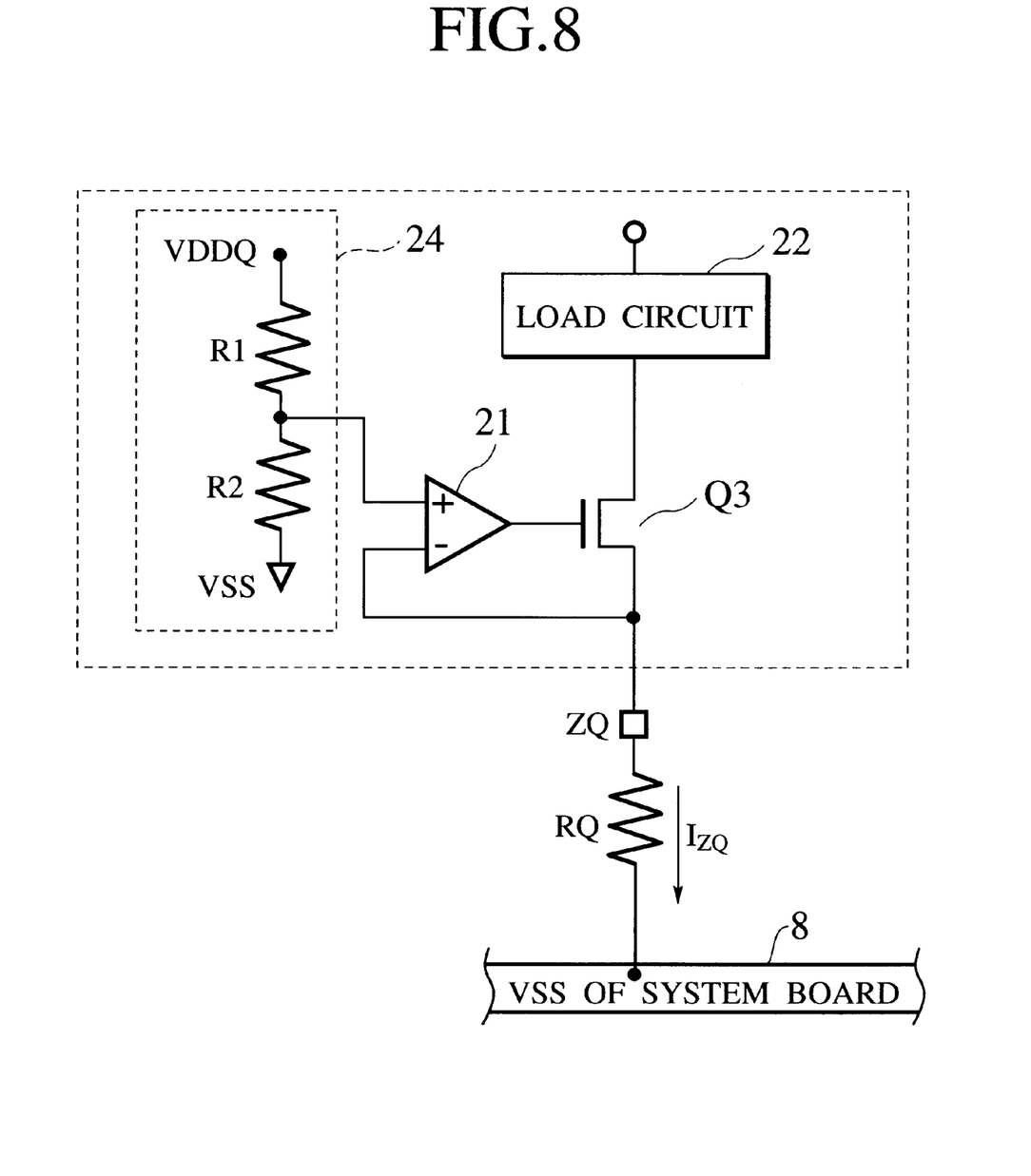
FIG. 8 shows an equivalent circuit representation of the external resistance monitoring circuit of FIG. 5.

The operation of the impedance matching circuit 100 of the first embodiment will be explained. The external resistance monitoring circuit 1 fixes the potential VZQ of the ZQ-terminal at the internally generated reference potential irrespective of the value of the external resistor RQ and monitors a current passing through the external resistor RQ. FIG. 8 shows the details of a part related to this operation.

In FIG. 8, the first high level supply voltage VDDQ is an exclusive power supply for the impedance matching circuit 100 and is lower than the second high level supply voltage VDD for the SRAM core array 54 and other circuits. By selecting the value of the first high level supply voltage VDDQ lower than that of the general second high level supply voltage VDD, it becomes easier to match the impedance. If the resistances, or the values of the resistors R1 and R2 are equal to each other, the node between the resistors R1 and R2 provides a reference potential of VDDQ/2, which is supplied to the comparator 21. The comparator 21 also receives the voltage VZQ of the ZQ-terminal, compares these voltages with each other, and controls the MOS transistor Q3 to equalize the two voltages with each other, thereby fixing the voltage VZQ of the ZQ-terminal at VDDQ/2. At this time, the external resistor RQ passes a current $I_{ZQ}$ corresponding to the resistance thereof.

The current mirror circuit of FIG. 6 provide the above current $I_{ZQ}$ to the first main electrodes (drain electrodes) of the respective MOS transistors $T_1$ to $T_N$ of the dummy buffer 2. At this time, the voltage VZQ of the ZQ-terminal is supplied to an input terminal of the comparator 32 of the matching controller 74. The other input terminal of the comparator 32 receives a voltage applied to the first main electrodes (drain electrodes) of the MOS transistors $T_1$ to $T_N$. The comparator 32 compares these voltages with each other and provides a resultant signal to the control circuit 31. The control circuit 31 provide a set of data consisting of "1" and "0" (set data) to the respective gate electrode of the MOS transistors $T_1$ to $T_N$ so that the voltages compared by the comparator 32 may be equalized with each other, thereby matching the combined impedance of the dummy buffer 2 with that of the external resistor RQ.

Namely, the control circuit 31 provides a set of signals $D_1$ to $D_N$ consisting of high ("1") and low ("0") to the respective gate electrodes of the MOS transistors $T_1$ to $T_N$ to prescribe the respective ON/OFF state of the MOS transistors $T_1$ to $T_N$ so as to determine the combined impedance of the dummy buffer 2.

According to the set of signals $D_1$ to $D_N$ used for the impedance matching of the dummy buffer 2, the control circuit 31 matches the impedance of the output buffer 3 with the impedance of the external resistor RQ or with a reciprocal of an integer multiple of the impedance of the external resistor RQ.

The first embodiment fixes the potential VZQ of the ZQ-terminal to which the user's external resistor RQ is connected, at the reference potential VDDQ/2 (the potential that defines the impedance of the output buffer 3). Accordingly, the potential applied to the external resistor RQ is always kept constant even if the value of the external resistor RQ varies. The first embodiment detects the current $I_{ZQ}$ passing through the external resistor RQ to correctly determine the impedance of the external resistor RQ.

Thereafter, the first embodiment matches the impedance of the dummy buffer 2 with the detected impedance of the external resistor RQ according to data that is free from errors due to the voltage dependence of the I-V characteristics of MOS transistors. Using this set of data, the first embodiment correctly matches the impedance of the output buffer 3, which is identical or similar to the dummy buffer 2, with the impedance of the external resistor RQ or an inverse multiple thereof.

The first embodiment is capable of controlling an impedance matching error of the output buffer 3 within the range of ±10% when the resistance value of the external resistor RQ is, for example, 175Ω≦RQ≦352Ω, thereby securing required product specifications. This improves a margin for circuit errors, simplifies the structure of the impedance matching circuit, and reduces the occupation area of the impedance matching circuit. Then the utilization efficiency of the real estate (or the chip area) improves, and the integration density of the LSI chip can be increased.

The comparator 32 may compare a voltage applied to the dummy buffer 2 with the reference voltage provided from the node between the resistors R1 and R2, and according to a comparison result, the control circuit 31 may match the impedance of the dummy buffer 2 with the impedance of the external resistor RQ. This configuration provides the same effect as the first embodiment mentioned above.

(SECOND EMBODIMENT)

As explained above, the first embodiment determines the impedance of the external resistor RQ from a detected current $I_{ZQ}$ passing through the external resistor RQ. According to the detected current $I_{ZQ}$, the first embodiment controls set of data bits $D_1$ to $D_N$ applied to the set of nMOS transistors $T_1$ to $T_N$ of the dummy buffer 2 so that a supply voltage applied to the MOS transistors $T_1$ to $T_N$ is equalized to the voltage VZQ of the ZQ-terminal, thereby matching the impedance of the dummy buffer 2 with the impedance of the external resistor RQ. Namely, to the set of data bits $D_1$ to $D_N$ determines the combined impedance of the pull-down output buffer 3. The combined impedance of the output buffer 3 is set to be "a" times the combined impedance of the dummy buffer 2 where "a" is a constant. Since the set of bias conditions of respective transistors in the dummy buffer 2 is identical to that of the output buffer 3, the buffers 2 and 3 provide the same operation characteristics. The constant "a" is simply determined from the gate width W ratio between the buffers 2 and 3, both having an identical gate length "1".

The output buffer 3 of the first embodiment is a pull-down buffer. On the other hand, a pull-up output buffer suffers from a back bias effect, and therefore, operates differently from the dummy buffer 2 of the first embodiment. To cope with this, a constant "b" is calculated from estimated transistor characteristics, and the impedance of the pull-up output buffer is set to be "b" times the impedance of the dummy buffer 2.

Practically, there is a possibility that the estimated and designed transistor characteristics differ from actual ones due to manufacturing process conditions. If this difference happens in the first embodiment, the operation characteristics of the pull-down output buffer 3 and dummy buffer 2 similarly shift and the constant "a" is unchanged. As a result, the first embodiment may control an impedance error of the pull-down output buffer 3 within ±10%. On the contrary, the operation characteristics of the pull-up output buffer differ from those of the dummy buffer 2 if the estimated transistor characteristics deviate from the actual ones, because the pull-up output buffer involves a back bias. This results in changing the constant "b" to cause a risk of exceeding the impedance error range of ±10% for the pull-up output buffer.

The back bias effect increases the on-state resistance $R_{ON}$ of respective transistors, or the combined impedance of the pull-up output buffer larger than that of the pull-down output buffer. Accordingly, using the same number of data bits as that for the pull-down output buffer for carrying out an impedance matching of the pull-up output buffer increases "a step error". Here, "the step error" is a difference between adjacent ones of data bits $D_1$ to $D_N$ that consist of "1" or "0" to determine the combined impedance of the buffer step by step. For example, a set of four data bits ($2^0:2^1:2^2:2^3$) forms 16 steps.

To cope with this problem, there is a necessity of increasing the number of data bits, i.e., more number of transistors must be used to carry out a precise impedance matching for the pull-up output buffer. This is unachievable if only a pull-down dummy buffer is employed like the first embodiment.

For a system employing a reduced high level supply voltage of, for example, 1.5 V, the pull-up output buffer must be made of pMOS transistors. In this case, the transistor characteristics of the pull-up output buffer quite differ from those of the dummy buffer of FIG. 5 made of nMOS transistors, and therefore, it is impossible to estimate the constant "b." In this case, it is imperative to prepare a pull-up dummy buffer made of pMOS transistors.

Figure 9:
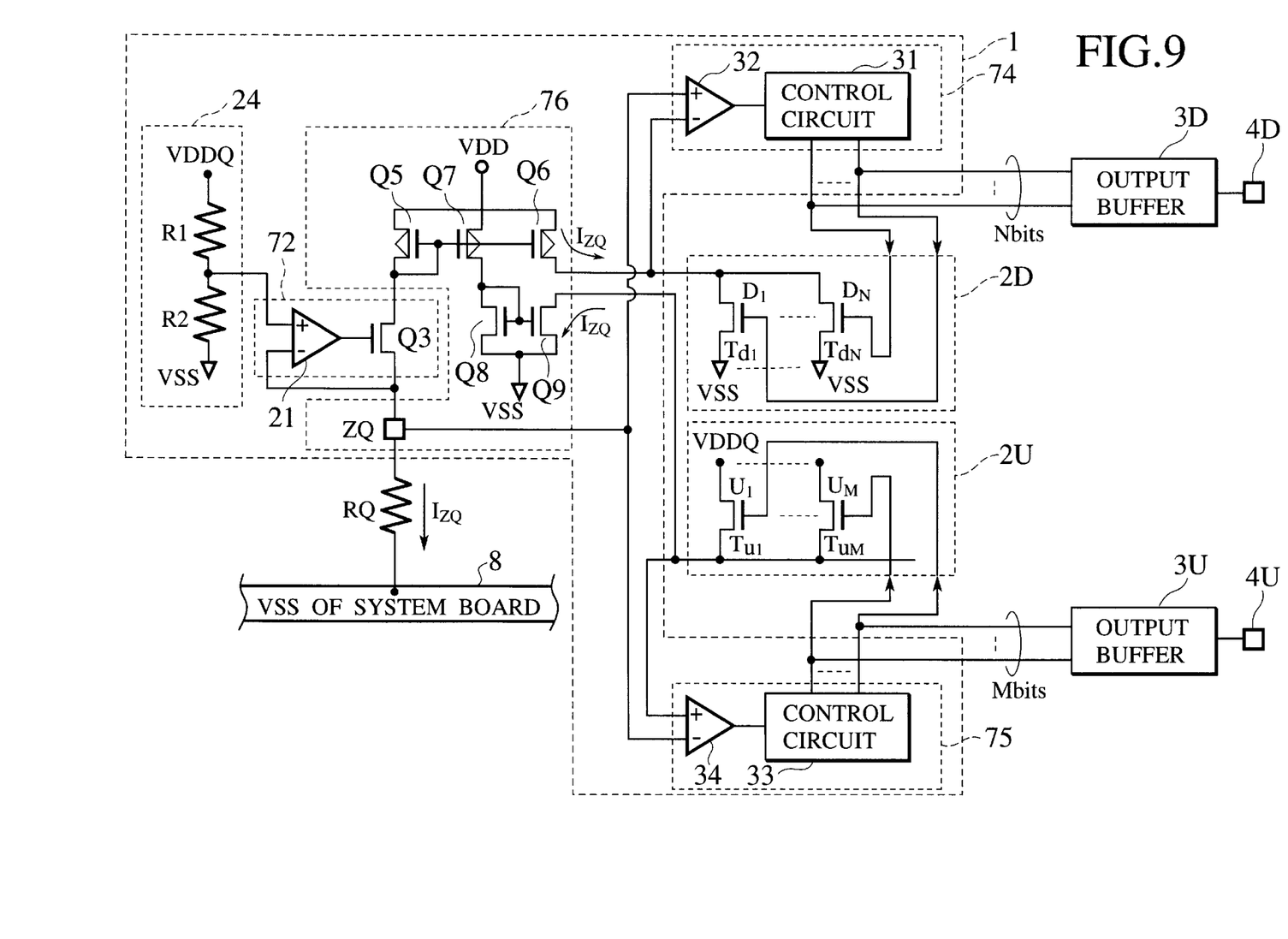
FIG. 9 shows an equivalent circuit representation of an output circuit merged in an LSI chip according to a second embodiment of the present invention.

FIG. 9 shows an output circuit of an LSI chip according to the second embodiment of the present invention. This output circuit solves the problem of the first embodiment.

The output circuit of the second embodiment has a pull-down output buffer 3D, a pull-up output buffer 3U, and an impedance matching circuit arranged in front of the buffers 3D and 3U. The impedance matching circuit has an external resistance monitoring circuit 1, a pull-down dummy buffer 2D, and a pull-up dummy buffer 2U. The external resistance monitoring circuit 1 has a generator 24, a potential controller 72, a detector 76, a pull-down matching controller 74, and a pull-up matching controller 75. The generator 24 has first and second voltage dividing resistors R1 and R2 that are connected in series to generate a reference potential. The resistor R1 is connected to a first high level voltage source for supplying a first high level supply voltage VDDQ that is exclusively used by the impedance matching circuit. The resistor R2 is connected to a low level voltage source VSS. The potential controller 72 has a comparator 21 and a MOS transistor Q3. The comparator 21 has an input terminal connected to a node between the resistors R1 and R2 and another input terminal connected to a specific terminal (ZQ-terminal), which is connected via a ZQ-pin of the package to an electrode terminal of an external resistor RQ. Another electrode terminal of the external resistor RQ is connected to VSS of system board, or to a system bus (second system bus) 8 having a low level supply voltage, which may be a ground level system bus. An output terminal of the comparator 21 is connected to the control electrode (gate electrode) of the MOS transistor Q3, which acts as a voltage control transistor. The potential controller 72 fixes a potential VZQ at the ZQ-terminal at the reference potential provided by the generator 24 irrespective of the value of the external resistor RQ. When the ZQ-terminal is fixed at the reference potential by the potential controller 72, the detector 76 detects a current passing through the external resistor RQ. The detector 76 has a first current mirror circuit made of MOS transistor (first transistor) Q5 and MOS transistor (second transistor) Q6 and a second current mirror circuit made of MOS transistor (fourth transistor) Q8 and MOS transistor (fifth transistor) Q9. The MOS transistor Q5 of the first current mirror circuit has a first main electrode connected to a second high level voltage source for supplying a second high level supply voltage VDD that is different from the first high level supply voltage VDDQ, a second main electrode connected to the MOS transistor Q3, and a control electrode (gate electrode) connected also to the MOS transistor Q3. The MOS transistor Q6 of the first current mirror circuit has a first main electrode connected to the second high level voltage source VDD, a control electrode connected to the control electrode of the MOS transistor Q5, and a second main electrode. The first current mirror circuit also has a MOS transistor (third transistor) Q7, which has a first main electrode connected to the second high level voltage source VDD, a control electrode connected to the control electrodes of the MOS transistors Q5 and Q6, and a second main electrode connected to the second current mirror circuit. The MOS transistor Q8 of the second current mirror circuit has a first main electrode and a control electrode both connected to the second main electrode of the MOS transistor Q7, and a second main electrode connected to the low level voltage source VSS. The MOS transistor Q9 of the second current mirror circuit has a first main electrode, a second main electrode connected to the low level voltage source VSS, and a control electrode connected to the control electrode of the MOS transistor Q8. In practice, the detector circuit 76 involves the ZQ-terminal and external resistor RQ to realize a detecting function.

The pull-down matching controller 74 has an impedance setting pull-down comparator 32 and a pull-down control circuit 31 to match the impedance of the pull-down output buffer 3D with the impedance of the pull-down external resistor RQ, the pull-down external resistor RQ is determined according to a current detected by the detector 76. Or the pull-down control circuit 31 matches the impedance of the pull-down output buffer 3D with an inverse multiple of the impedance of the pull-down external resistor RQ. An input terminal of the pull-down comparator 32 is connected to the ZQ-terminal and another input terminal thereof to the second main electrode (source electrode) of the MOS transistor Q6. An output terminal of the pull-down comparator 32 is connected to the pull-down control circuit 31, which controls the impedance of the pull-down dummy buffer 2D and that of the pull-down output buffer 3D that is identical or similar to the pull-down dummy buffer 2D, to predetermined levels. The pull-down dummy buffer 2D is an N-bit parallel circuit made of nMOS transistors $T_{d1}$ to $T_{dN}$ having different gate width Ws having a ratio of, for example, $2^0:2^1:2^2:2^3: \ldots :2^{(N-1)}$ and the like. The first main electrodes (drain electrodes) of the respective nMOS transistors $T_{d1}$ to $T_{dN}$ composing the pull-down dummy buffer 2D are connected to the another input terminal of the pull-down comparator 32 and also to the second main electrode (source electrode) of the MOS transistor Q6. The second main electrodes (source electrodes) of the respective nMOS transistors $T_{d1}$ to $T_{dN}$ are connected to the low level power source Vss. The pull-down output buffer 3D is also an N-bit parallel circuit made of nMOS transistors having the ratio of $2^0:2^1:2^2:2^3: \ldots :2^{(N-1)}$, and the like.

The pull-up matching controller 75 has an impedance setting pull-up comparator 34 and a pull-up control circuit 33 and matches the impedance of the pull-up output buffer 3U with the impedance of the pull-up external resistor RQ detected according to a current flowing to the detector 76, or an inverse multiple of the impedance of the pull-up external resistor RQ. An input terminal of the pull-up comparator 34 is connected to the ZQ-terminal and another input terminal thereof to the first main electrode (drain electrode) of the MOS transistor Q9. An output terminal of the pull-up comparator 34 is connected to the pull-up control circuit 33, which controls the impedance of the pull-up dummy buffer 2U and that of the pull-up output buffer 3U that is identical or similar to the pull-up dummy buffer 2U, to predetermined levels. The pull-up dummy buffer 2U is an M-bit parallel circuit made of nMOS transistors $T_{u1}$ to $T_{uM}$ having different gate width Ws having a ratio of, for example, $2^0:2^1:2^2:2^3: \ldots :2^{(M-1)}$, and the like. The first main electrodes (drain electrodes) of the nMOS transistors $T_{u1}$ to $T_{uM}$ composing the pull-up dummy buffer 2U are connected to the first high level voltage source VDDQ. The second main electrode (source electrodes) of the nMOS transistors $T_{u1}$ to $T_{uM}$ are connected to the another input terminal of the pull-up comparator 34 and to the first main electrode (drain electrode) of the MOS transistor Q9. The pull-up output buffer 3U is also an M-bit parallel circuit made of nMOS transistors having the ratio of $2^0:2^1:2^2:2^3: \ldots :2^{(M-1)}$, and the like.

The operation of the second embodiment will be explained. Like the first embodiment, the external resistance monitoring circuit 1 of the second embodiment fixes the potential of the ZQ-terminal at an internally generated reference potential irrespective of the external resistor RQ. A current $I_{ZQ}$ passing through the external resistor RQ is transferred to and flows in the pull-down dummy buffer 2D through the first current mirror circuit. At the same time, the current $I_{ZQ}$ flowing in the pull-up dummy buffer 2U is transferred to and flows in the second current mirror circuit.

At this time, the pull-down comparator 32 receives the voltage VZQ of the ZQ-terminal and a voltage applied to the drain electrodes of the nMOS transistors $T_{d1}$ to $T_{dN}$ of the pull-down dummy buffer 2D, compares the voltages with each other, and provides a comparison result to the pull-doen control circuit 31.

Similarly, the pull-up comparator 34 receives the voltage VZQ of the ZQ-terminal and a voltage applied to the source electrodes of the nMOS transistors $T_{u1}$ to $T_{uM}$ of the pull-up dummy buffer 2U, compares the voltages with each other, and provides a comparison result to the pull-up control circuit 33.

The pull-down control circuit 31 equalizes the compared voltages with each other by applying set of data signals $D_1$ to $D_N$ of "1s" and "0s" to the gate electrodes of the MOS transistors $T_{d1}$ to $T_{dN}$ to determine the combined impedance of the pull-down dummy buffer 2D. According to the set of data signals $D_1$ to $D_N$, the pull-down control circuit 31 matches the impedance of the pull-down output buffer 3D with the impedance of the pull-down external resistor RQ or with a reciprocal of an integer multiple thereof.

The pull-up control circuit 33 equalizes the compared voltages with each other by applying a set of data signals $U_1$ to $U_M$ of "1s" and "0s" to the gate electrodes of the MOS transistors $T_{u1}$ to $T_{uM}$ to determine the combined impedance of the pull-up dummy buffer 2D. According to the set of data signals $U_1$ to $U_M$, the pull-up control circuit 33 matches the impedance of the pull-up output buffer 3U with the impedance of the pull-up external resistor RQ or with a reciprocal of an integer multiple thereof.

In this way, the second embodiment employs not only the pull-down dummy buffer 2D but also the pull-up dummy buffer 2U to realize an impedance matching of the pull-up output buffer 3U according to the set of data ($U_1$ to $U_M$) used for an impedance matching of the pull-up dummy buffer 2D. This arrangement is capable of securing a matching error within ±10% for both the pull-down and pull-up output buffers 3D and 3U irrespective of processing fluctuations.

Although the impedance matching of the output buffers 3D and 3U can be carried out according to the same bits (N=M), the number of the MOS transistors $T_{u1}$ to $T_{uM}$ of the pull-up dummy buffer 2U may preferable be increased (N<M).

For a system employing a reduced high level supply voltage of, for example, 1.5 V, the pull-down dummy buffer 2D may be a parallel circuit made of nMOS transistors, and the pull-up dummy buffer 2U a parallel circuit made of pMOS transistors.

According to the second embodiment, the external resistor RQ, the ZQ-terminal, and the peripheral circuits for detecting a current $I_{ZQ}$ passing through the external resistor RQ commonly serve for the pull-down and pull-up dummy buffers 2D and 2U. If a larger circuit scale and increased power consumption are allowed, all or some of the peripheral circuits may be prepared for each of the buffers 2D and 2U.

(OTHER EMBODIMENTS)

Various modifications will become possible for those skilled in the art after receiving the teachings of the present disclosure without departing from the scope thereof.

The first and second embodiments of FIGS. 6 and 9 employ the second high level supply voltage VDD, which is the power supply for general circuits including the peripheral circuits and the internal circuit such as the memory core, as the high level voltage source for the current mirror circuits. Instead of the second high level supply voltage VDD, the current mirror circuits may use the first high level supply voltage VDDQ. In this case, the circuit for detecting the current $I_{ZQ}$ passing through the external resistor RQ and the output buffers use the same voltage source. As a result, noise in the first high level supply voltage VDDQ appears both in the matching circuits and output buffers, to prevent a deterioration of matching accuracy. Therefore, it is always possible to correctly match the impedance of the output buffer 3 with the impedance of the external resistor RQ.

The comparators 32 and 34 of FIG. 9 may compare voltages applied to the dummy buffers 2D and 2U with the reference voltage provided from the node between the resistors R1 and R2 so that comparison results are used to match the impedance of the dummy buffers 2D and 2U with the impedance of the external resistor RQ.

In this way, the present invention covers many other embodiments not mentioned here, and the technical scope of the present invention are defined only by appended claims.

What is claimed is:

1. An impedance matching circuit connected between an output buffer and a specific terminal disposed on a semiconductor chip for connecting an external resistor, comprising:
   (a) an external resistance monitoring circuit having:
      a generator for generating a reference potential;
      a potential controller for fixing a potential of the specific terminal at the reference potential;
      a detector for detecting a current passing through the external resistor; and
      a matching controller for matching an impedance of the output buffer with an impedance of the external resistor determined according to a current detected by the detector, or an inverse multiple of the impedance of the external resistor; and
   (b) a dummy buffer connected to the matching controller and made of transistors connected in parallel.

2. The impedance matching circuit of claim 1, wherein the generator is a voltage dividing circuit that has:
   a first voltage dividing resistor connected to a first high level voltage source for supplying a first high level supply voltage that is exclusively used by the impedance matching circuit; and
   a second voltage dividing resistor connected to a low level voltage source.

3. The impedance matching circuit of claim 1, wherein the potential controller has:
   a comparator having an input terminal connected to a node between the first and second voltage dividing resistors and another input terminal connected to the specific terminal; and
   a voltage controlling transistor having a control electrode connected to an output terminal of the comparator.

4. The impedance matching circuit of claim 1, wherein the detector has:
   a first transistor having a first main electrode connected to a second high level voltage source for supplying a second high level supply voltage, a second main electrode connected to the voltage controlling transistor, and a control electrode also connected to the voltage controlling transistor; and
   a second transistor having a first main electrode connected to the second high level voltage source and a control electrode connected to the control electrode of the first transistor.

5. The impedance matching circuit of claim 4, wherein the second high level supply voltage differs from the first high level supply voltage in terms of potential.

6. The impedance matching circuit of claim 4, wherein the second high level supply voltage is the same as the first high level supply voltage in terms of potential.

7. The impedance matching circuit of claim 1, wherein the matching controller has:
   a comparator having an input terminal connected to the specific terminal and another terminal connected to a second main electrode of the second transistor; and
   a control circuit connected to an output terminal of the comparator.

8. The impedance matching circuit of claim 1, wherein:
   the detector sends a current equal to the current passing through the external resistor to the dummy buffer;
   the matching controller provides control data to control a voltage applied to control electrodes of the transistors of the dummy buffer, to equalize a potential of first main electrodes of the transistors of the dummy buffer to the potential of the specific terminal; and
   the control data is used to match the impedance of the output buffer with the impedance of the external resistor or an inverse multiple of the impedance of the external resistor.

9. An impedance matching circuit connected to pull-down and pull-up output buffers and to a specific terminal disposed on a semiconductor chip for connecting an external resistor, comprising:
   (a) an external resistance monitoring circuit having:
      a generator for generating a reference potential;
      a potential controller for fixing a potential of the specific terminal at the reference potential;
      a detector for detecting a current passing through the external resistor;
      a pull-down matching controller for matching an impedance of the pull-down output buffer with a pull-down impedance of the external resistor determined according to a current detected by the detector, or an inverse multiple of the pull-down impedance of the external resistor; and
      a pull-up matching controller for matching an impedance of the pull-up output buffer with an pull-up impedance of the external resistor determined according to a current flowing to the detector, or an inverse multiple of the pull-up impedance of the external resistor;
   (b) a pull-up dummy buffer connected to the pull-up matching controller and pull-up output buffer and made of transistors connected in parallel; and
   (c) a pull-down dummy buffer connected to the pull-down matching controller and pull-down output buffer and made of transistors connected in parallel.

10. The impedance matching circuit of claim 9, wherein the generator is a voltage dividing circuit that has:
   a first voltage dividing resistor connected to a first high level voltage source for supplying a first high level supply voltage that is exclusively used by the impedance matching circuit; and
   a second voltage dividing resistor connected to a low level voltage source.

11. The impedance matching circuit of claim 9, wherein the potential controller has:
   a comparator having an input terminal connected to a node between the first and second voltage dividing resistors and another input terminal connected to the specific terminal; and
   a voltage controlling transistor having a control electrode connected to an output terminal of the comparator.

12. The impedance matching circuit of claim 9, wherein the detector has:
   a first transistor having a first main electrode connected to a second high level voltage source for supplying a second high level supply voltage, a second main electrode connected to the voltage controlling transistor, and a control electrode also connected to the voltage controlling transistor;
   a second transistor having a first main electrode connected to the second high level voltage source and a control electrode connected to the control electrode of the first transistor;
   a third transistor having a first main electrode connected to the second high level voltage source and a control electrode connected to the control electrodes of the first and second transistors;
   a fourth transistor having a first main electrode and a control electrode both connected to a second main electrode of the third transistor, and a second main electrode connected to the low level voltage source; and
   a fifth transistor having a second main electrode connected to the low level voltage source and a control electrode connected to the control electrode of the fourth transistor.

13. The impedance matching circuit of claim 12, wherein the second high level supply voltage differs from the first high level supply voltage in terms of potential.

14. The impedance matching circuit of claim 12, wherein the second high level supply voltage is equal to the first high level supply voltage in terms of potential.

15. The impedance matching circuit of claim 9, wherein the pull-down matching controller has:
   a pull-down comparator having an input terminal connected to the specific terminal and another input terminal connected to a second main electrode of the second transistor; and
   a pull-down control circuit connected to an output terminal of the pull-down comparator.

16. The impedance matching circuit of claim 9, wherein the pull-up matching controller has:
   a pull-up comparator having an input terminal connected to the specific terminal and another input terminal connected to a first main electrode of the fifth transistor; and
   a pull-up control circuit connected to an output terminal of the pull-up comparator.

17. The impedance matching circuit of claim 9, wherein:
   the detector sends a current that is equal to a current passing through the external resistor to the pull-down dummy buffer;
   the pull-down matching controller provides control data to control a voltage applied to control electrodes of the transistors of the pull-down dummy buffer, to equalize a potential of first main electrodes of the transistors of the pull-down dummy buffer to a potential of the specific terminal; and
   the control data is used to match the impedance of the pull-down output buffer with the pull-down impedance of the external resistor or an inverse multiple of the pull-down impedance of the external resistor.

18. The impedance matching circuit of claim 9, wherein:
   the pull-up dummy buffer sends a current that is equal to a current passing through the external resistor to the detector;
   the pull-up matching controller provides control data to control a voltage applied to the control electrodes of the transistors of the pull-up dummy buffer, to equalize a potential of first main electrodes of the transistors of the pull-up dummy buffer to a potential of the specific terminal; and
   the control data is used to match the impedance of the pull-up output buffer with the pull-up impedance of the external resistor or an inverse multiple of the pull-up impedance of the external resistor.

19. The impedance matching circuit of claim 9, wherein the number of the transistors that form the pull-down dummy buffer differs from the number of the transistors that form the pull-up dummy buffer.

20. The impedance matching circuit of claim 9, wherein:
   the transistors that form the pull-down dummy buffer are nMOS transistors; and
   the transistors that form the pull-up dummy buffer are pMOS transistors.

21. A semiconductor integrated circuit comprising:
   (a) a semiconductor chip;
   (b) an internal circuit disposed on the semiconductor chip;
   (c) peripheral circuits for driving the internal circuit;
   (d) a specific terminal disposed on the semiconductor chip for connecting an external resistor;
   (e) an output buffer connected to the peripheral circuits;
   (f) an external resistance monitoring circuit connected to the specific terminal, having:
      a generator for generating a reference potential;
      a potential controller for fixing the potential of the specific terminal at the reference potential;
      a detector for detecting a current passing through the external resistor; and
      a matching controller for matching an impedance of the output buffer with a impedance of the external resistor determined according to a current detected by the detector, or an inverse multiple of the impedance of the external resistor;
   (g) a dummy buffer connected between the external resistance monitoring circuit and the output buffer and made of transistors connected in parallel; and
   (h) an input/output terminal connected to the output buffer.

22. A computer system comprising:
   (a) a first system bus;
   (b) a second system bus held at low level supply voltage;
   (c) an external resistor connected to the second system bus; and
   (d) a semiconductor integrated circuit having:
      a semiconductor chip;

an internal circuit disposed on the semiconductor chip;
peripheral circuits for driving the internal circuit;
a specific terminal disposed on the semiconductor chip for connecting the external resistor;
an output buffer connected to the peripheral circuits;
an external resistance monitoring circuit connected to the specific terminal, having:
  a generator for generating a reference potential;
  a potential controller for fixing the potential of the specific terminal at the reference potential;
  a detector for detecting a current passing through the external resistor; and
  a matching controller for matching an impedance of the output buffer with an impedance of the external resistor determined according to a current detected by the detector, or an inverse multiple of the impedance of the external resistor;
a dummy buffer connected between the external resistance monitoring circuit and the output buffer and made of transistors connected in parallel; and
an input/output terminal connected between the output buffer and the first system bus.

* * * * *